US00RE33957E

United States Patent [19]

Nakazawa et al.

[11] E Patent Number: Re. 33,957

[45] Reissued Date of Patent: Jun. 9, 1992

[54] HIGH FREQUENCY NARROW-BAND MULTI-MODE FILTER

[75] Inventors: Yuzo Nakazawa; Kazuo Ono; Masaki Tanaka; Takao Morita; Takefumi Kurosaki, all of Samukawa, Japan

[73] Assignee: Toyo Communication Equipment Co., Ltd., Kanagawa, Japan

[21] Appl. No.: 849,527

[22] Filed: Apr. 8, 1986

Related U.S. Patent Documents

Reissue of:

[64] Patent No.: 4,542,356
Issued: Sep. 17, 1985
Appl. No.: 517,511
Filed: Jul. 26, 1983

[51] Int. Cl.[5] ..... H03H 9/64

[52] U.S. Cl. ..... 333/195; 310/313 D; 333/187; 333/196

[58] Field of Search ..... 333/150-155, 333/193-196; 310/313 R, 313 A, 313 B; 331/107 A; 364/821

[56] References Cited

U.S. PATENT DOCUMENTS

| | | | |
|---|---|---|---|
| 3,600,710 | 8/1971 | Adler et al. | 333/193 |
| 4,060,777 | 11/1977 | Tiersten et al. | 310/366 |
| 4,160,219 | 7/1979 | Kuny | 333/151 |
| 4,166,258 | 8/1979 | Tseng | 310/313 D X |
| 4,166,987 | 9/1979 | Coldren | 333/193 |
| 4,331,943 | 5/1982 | Cross et al. | 333/195 X |
| 4,480,237 | 10/1984 | Yamada | 310/313 R X |

FOREIGN PATENT DOCUMENTS

| | | | |
|---|---|---|---|
| 3307 | 1/1983 | Japan | 333/195 |
| 12418 | 1/1983 | Japan | 333/195 |

OTHER PUBLICATIONS

Yamada et al—"Double Mode Filter Based on Elastically Coupled Saw Resonators", Report on Symposium of Electronics and Communication of Japan, The Institute of Electronics and Communication Engineers of Japan, US77-33, Aug. 19, 1977; pp. 29-34.

Onoe M. & Tumanji, H.; "Analysis of Piezoelectric Resonator Vibratory in Trapped Energy Mode"; Report of *Electronics Communication*, Japan; No. 9 pp. 84-93, Sep. 1965.

Nakazawa, Y.; "High Frequency Crystal Electromechanical Filters and Their Characteristics" *Toyo Comm. Equip. Company, Japan;* published Dec., 1963; translation included.

Haydl, W. H. et al.; "Multimode SAW Resonators—A method to study the Optimum Resonator Design"; 1976 *Ultrasonics Syposium Proc;* Annap Md; 29 Sep.-1 Oct. 1976; pp. 287-296.

Hartmann, Clinton S.; "Recent Advances in SAW Devices"; 1977 NTC conference; 5-7 Dec. 1977; pp. 16:2-1 to 16:2-5.

Yamada and Shimuzo—"Double Mode Filter by Elastically Coupled SAW Resonators", Lectures of the Acoustic Society of Japan, Oct. 1977; pp. 456-466.

Yamada et al.—"The Design of a Double-Mode SAW Resonator Filter Utilizing Waveguide Coupling", Lectures of the Acoustic Society of Japan, Oct. 1980; pp. 65-66.

*Primary Examiner*—Eugene R. LaRoche
*Assistant Examiner*—Benny T. Lee
*Attorney, Agent, or Firm*—Graham & James

[57] ABSTRACT

A high frequency narrow-band pass multi-mode filter in constructed in such manner that SAW of SSBW resonators are closely disposed to each other on a single piezoelectric substrate to generate different vibration modes of different resonance frequencies, conditions that the resonators are acoustically coupled to each other to cause these vibration modes, are experimentally found, and the above conditions are satisfied by the filter.

In order to reduce the ohmic loss of a very narrow common bus bar, the number of strip pairs of electrode in both interdigital transducers (hereinafter referred to as IDT) is minimized and instead reflectors are provided on the both sides TDTs to compensate for the reduction of its Q value. A part of the bus bar for the IDT electrodes is formed integral with some or all of gratings of the reflectors, whereby the connecting positions of the grating electrodes with respect to lead terminals can be positioned with a high freedom.

26 Claims, 7 Drawing Sheets

(a)

(b)

| W \ g | 1 λ | 1.5 λ | 3 λ | 6 λ |
|---|---|---|---|---|
| 5 λ | ○ | ○ | ○ | △ |
| 10 λ | ○ | ○ | ○ | × |
| 20 λ | △ | × | × | × |

· N = 500
· h = 2.2% λ
· f = 280 MHz
○ COUPLING
△ VERY WEAK COUPLING
× NO COUPLING

HIGH FREQUENCY NARROW-BAND MULTI-MODE FILTER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a high frequency narrow-band multi-mode filter which comprises surface acoustic wave (hereinafter, referred to as SAW) resonators or surface skimming bulk wave (hereinafter, referred to as SSBW) resonators and which exhibits a narrow band pass characteristic of between several tens of megahertz and one gigahertz.

2. Description of the Prior Art

Band pass filters for frequencies above 50 MHz include an LC filter, a spiral filter, a SAW filter or a band pass filter in which resonance elements or inductors in a basic circuit are replaced with SAW resonators.

However, such band pass filters have the following defects.

In the case of the LC and spiral filters, they both have a low Q value. In particular, the spiral filter is large in size. In the case of the SAW filter, on the other hand, it has a relatively wide band and a large insertion loss. In addition, there occur ripples in its pass band due to triple transit echo (TTE).

Finally, in the case of the band pass filter of the type where resonance elements are replaced with SAW resonators, this type of filter is the same as a conventional crystal filter in principle. However, when it is to be operated for high frequencies above 100 MHz, it has been very difficult to set or fix the resonance frequencies of the elements and differences therebetween with high accuracy.

SUMMARY OF THE INVENTION

Accordingly, it is an object of the present invention to provide a narrow band pass filter with a high Q value and stability which can be suitably used for a high frequency range between several tens of megahertz and one gigahertz and which can be manufactured highly compactedly and inexpensively.

According to a first feature of the present invention, since the band width of the filter can be designed with a considerable flexibility, an intermediate stage filter and associated local oscillator in a mobile radio equipment, which tends to operate on higher frequencies with crowded frequency allocation, can be replaced with the filter of the present invention, whereby the equipment can be effectively made compact, light in weight and inexpensive.

According to a second feature of the invention, a common bus bar for SAW or SSBW resonators used in a multi-mode filter is made very narrow and correspondingly the loss of the filter is increased, but the employment of such a structure, as will be disclosed later for the bus bar, enables the minimization of the ohmic loss of the bus bar and thus of the filter loss and also enables the easy connection of the bar to the lead terminals of resonator electrodes.

According to one aspect of the present invention, there is provided a high frequency narrow-band pass multi-mode filter wherein SAW or SSBW resonators are closely disposed to each other on a single piezoelectric substrate to generate different vibration modes of different resonance frequencies, conditions such that the resonators are acoustically coupled to each other to cause these vibration modes, are experimentally found, and these conditions are satisfied by said filter.

According to another apsect of the invention, there is provided a so-called reflector type multi-mode filter wherein, in order to reduce the ohmic loss of the very narrow common bus bar, the number of strip pairs of electrodes in both interdigital transducers (hereinafter referred to as IDTs) is minimized and instead reflectors are provided on both sides of the IDTs to compensate for the reduction of its Q value. A part of the bus bar for the IDT electrodes is formed integral with some or all of the gratings of the reflectors, whereby the connecting positions of the grating electrodes with respect to lead terminals can be positioned with great freedom.

According to a further aspect of the invention, there is provided a reflector type multi-mode filter based on SAW or SSBW resonators, wherein the common bus bar is extended across gratings of the reflectors so that the width of the bus bar is increased gradually toward both edges of the piezo-electric substrate while the bus bar is connected or not connected to the reflector gratings.

According to yet another aspect of the invention, there is provided a reflector type multi-mode filter based on SAW or SSBW resonators, wherein electrode lead patterns are provided in place between the IDTs and reflectors, one end of the lead pattern being connected to the common bus bar and the other end being extended to a peripheral edge of the piezo-electric substrate.

According to a still further aspect of the invention, there is provided a reflector type multi-mode filter based on SAW or SSBW resonators, wherein the common bus bar is extended across grooves of the reflectors up to both edges of the substrate while not connected to the grooves, and the width of the bus bar is increased gradually toward both edges of the piezo-electric substrate.

BRIEF DESCRIPTION OF THE DRAWINGS

The above and other objects and features of the present invention will become clear from the following description with refernece to the accompanying drawings, in which.

DESCRIPTION OF THE PREFERRED EMBODIMENTS

The present invention will be detailed on the basis of a theory of estimating parameters by determining the acoustic coupling intensity between resonators and of the results of experiments conducted in accordance with the theory.

Several types of filters based on the acoustic coupling between SAW resonators are already proposed, but they are still at a conceptional stage and there does not actually exist, so far, such a filter that the acoustic coupling is provided on the basis of particular conditions on the electrode structure of the SAW resonators.

The inventors, in examinting the conditions in which the acoustic coupling occurs, have estimated the conditions as follows on the basis of the study results of conventional SAW and SSBW resonators.

Explanation will be made for the case where two SAW resonators are used, for the sake of brevity. That is, as shown in FIGS. 1(a) to *1*(c), two SAW resonators 2 and 3 are disposed on a piezo-electric substrate 1 in a parallel and closely opposed relation so that, when the resonators 2 and 3 are excited and the resultant SAWs are acoustically coupled to each other, the resonators 2 and 3 generate two vibration modes as shown in FIGS. 1(b) and *1*(c), that is, the symmetrical mode (s-mode) and the anti-symmetrical mode (a-mode).

Figure 2:
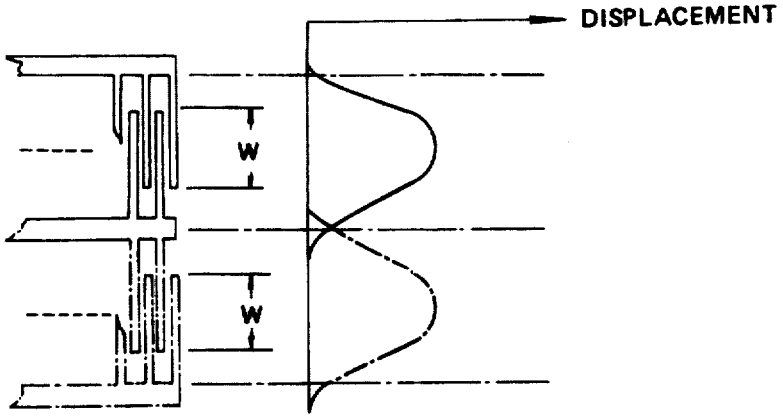
FIG. 2 is a diagram explaining the distribution of vibration energy (displacement) caused by the SAW generated in the adjacent two resonators.

Now, consideration will be given to the acoustic coupling conditions. FIG. 2 shows a vibration mode of a single SAW resonator. It is known that the vibration energy leaks beyond the acoustic aperture of the resonators as illustrated in FIG. 2 and the vibration mode depends on the width w, and thus it will be obvious that the width w is one of the factors determining the acoustic coupling intensity between the both resonators.

On the other hand, fact that there exists the acoustic coupling between the adjacent resonators means that the vibration energy of one of the resonators is affected by that of the other. Therefore, it is obviously necessary to dispose the resonators in a sufficiently close relationship to each other.

Figure 3:
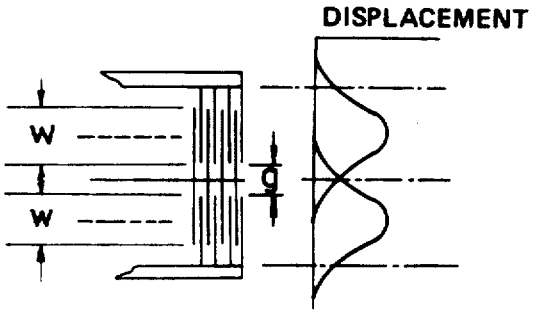
FIGS. 3(a) and (b) are diagrams explaining a relationship between the two vibration modes shown in FIG. 1 and the width of an acoustic aperture (overlapped length of IDT fingers) w and gap between acoustic apertures of both resonators g of the resonators.
Figure 3:
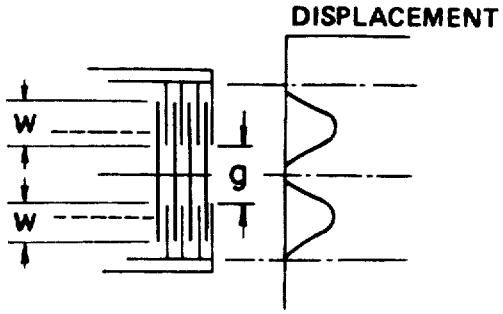

Referring now to FIGS. 3(a) and 3(b), there is qualitatively illustrated a relationship between the vibration mode and the acoustic coupling intensity for larger and smaller values of g. It is clear from the drawing that the gap g is a parameter indicative of the proximity of the resonators. More specifically, it is considered that, so long as the value g is greater than a [certin] *certain* value, any acoustic coupling will not take place between the resonators 2 and 3 as exaggeratedly depicted in FIG. 3(b), even if the other parameters are in their coupling generation ranges.

From the above consideration, the inventors have concluded that the width w and the gap g will determine the acoustic coupling conditions.

In other words, when the parameters w and g are selected to be below certain values respectively, the acoustic coupling will take place between resonators 2 and 3 and the coupling intensity will depend largely upon the parameters w and g. Therefore, when the two SAW resonators are designed so that the two parameters satisfy the above conditions, acoustic coupling will take place, whereby two modes (s-mode and a-mode) of vibration will be generated, as has been mentioned above.

Figure 4:
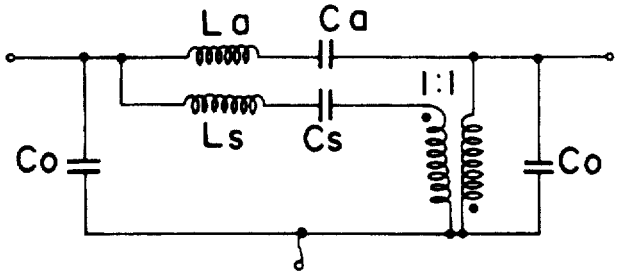
FIG. 4 is an equivalent circuit of the SAW double mode filter.
Figure 5:
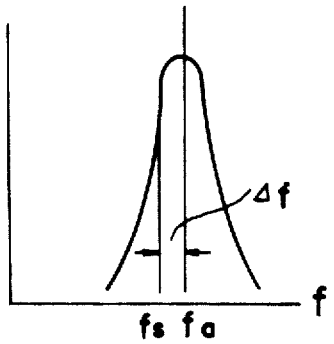
FIG. 5 shows the relation between the attenuation characteristics of the filter and the resonance frequencies of the two vibration modes.

The double mode SAW filter arranged as described above can be expressed by way of an equivalent circuit as shown in FIG. 4 wherein the resonance frequencies $f_a$ and $f_s$ of branch circuits respectively including elements [$L_1$] $L_a$ and $C_a$, and elements $L_s$ and $C_s$ correspond to anti-symmetrical and symmetrical vibration mode resonance frequencies respectively, and the relation $f_a > f_s$ is always satisfied, providing a frequency difference $\Delta f = f_a - f_s$. Further, two times the frequency difference $\Delta f$, i.e., $2\Delta f$, is nearly equal to the band width of the filter. *$C_o$ in FIG. 4 represents an equivalent parallel capacitance of the resonators which constitute the filter of the present invention.* FIG. 5 shows the relationship between the attenuation characteristic and the frequencies [$F_a$] $f_a$ and $f_s$.

On the basis of the above logical consideration and several experiments, the way in which the frequency difference $\Delta f$ varies with the parameters w and g will now be described.

Figure 1:
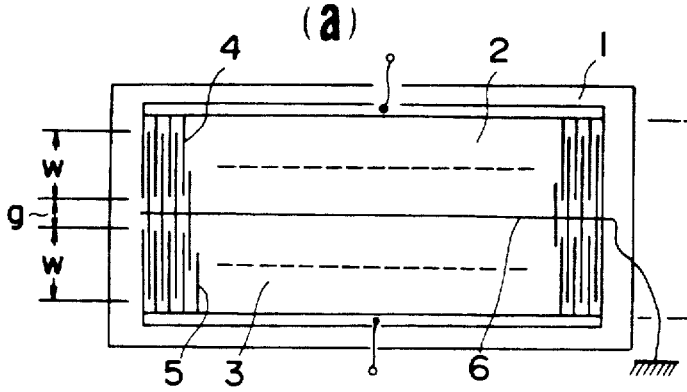
FIG. 1 parts (a) to (c) show a basic electrode structure of a SAW double mode filter according to the invention and two vibration mode patterns generated by the same filter, respectively.
Figure 1:
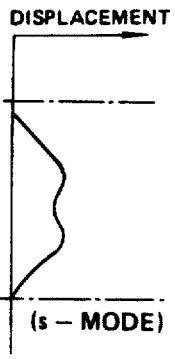
Figure 1:
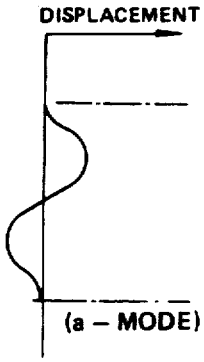

First, an ST cut quartz crystal substrate having a cut angle 37° and a good frequency-temperature characteristic, has been employed as the piezo-electric substrate of a filter to be used in the experiments and aluminum electrodes have been formed on a polished main surface of the substrate by photolithography. The film thicknesses of the electrodes have been selected to be 1.5, 2.2 and 3.0% of the wavelength $\lambda$ of a surface wave to be excited and the electrode fingers of the upper and lower resonators have been arranged to be equal in phase (that is, to be symmetrical with respect to the common bus bar 6 as shown in FIG. 1). Of course, the electrode fingers may be arranged to be asymmetrical.

The number of such electrode finger pairs of IDTs has been selected to be 400, 500, 600 and 800 and a center frequency has been selected to be 280 MHz.

Under the above conditions, experiments have been conducted for several different values of the parameters w and g. The results are as shown in FIGS. 6 and 7.

Figure 7:
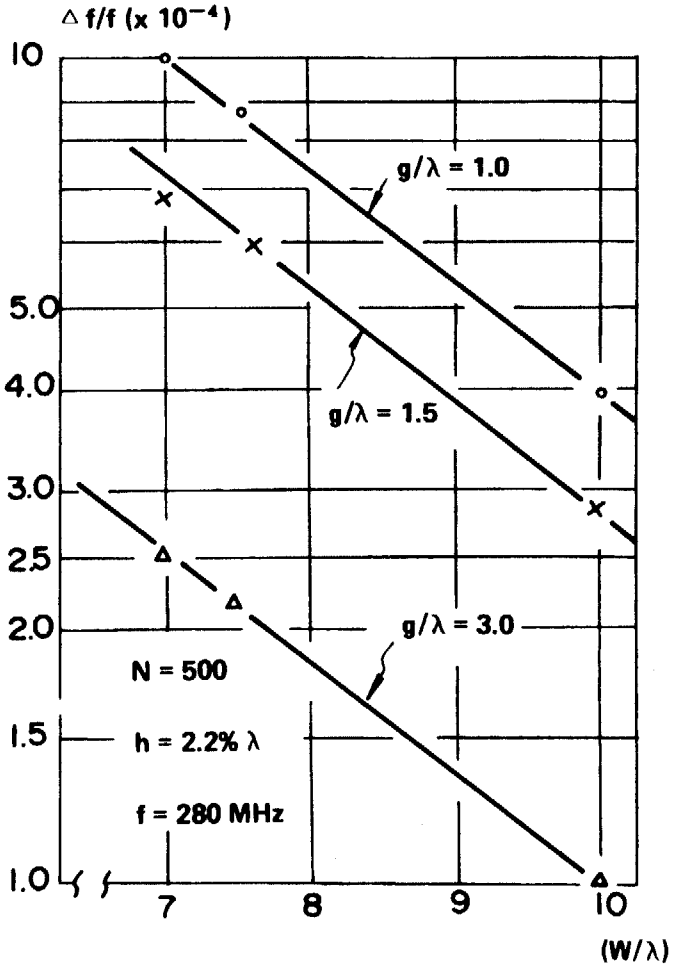
FIGS. 6 and 7 are experimental data showing the dependence of acoustic coupling intensity on parameters g and w when the width w is fixed and when the gap g is fixed, respectively.
Figure 6:
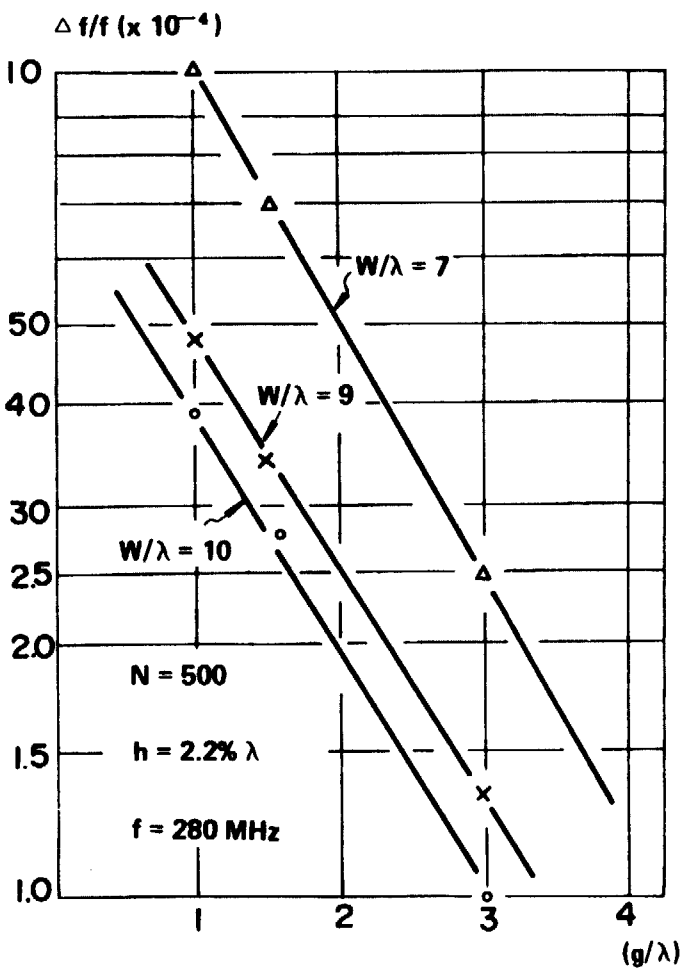

More specifically, FIG. 6 is a graph showing the acoustic coupling intensity when the parameter w is fixed and the parameter g is varied, while FIG. 7 is a graph showing the acoustic coupling intensity when the parameter g is fixed and the parameter w is varied.

It has been found from FIGS. 6 and 7 that the acoustic coupling between the resonators is more strongly affected by the gap g of the common bus bar than by the width w.

When a new parameter $D = 0.3(w/\lambda) + 0.7(g/\lambda)$, indicative of the intensity of the acoustic coupling affected by the parameters w and g, is assumed, an experimental equation [$\alpha f$] $\Delta f/f = K.\exp^{(-D)}$ can be obtained, where $f \approx f_a$ is the center frequency of the filter, $\Delta f$ is a frequency difference between the a-mode and s-mode, and K is a proportional constant and was determined to be $2.2 \times 10^{-2}$ in the above experiment. The experimental results are given in FIG. 8. It will be easily understood that, at the time of designing an actual filter, the values w and g are properly selected to meet the specifications of the filter.

Figures 8, 9:
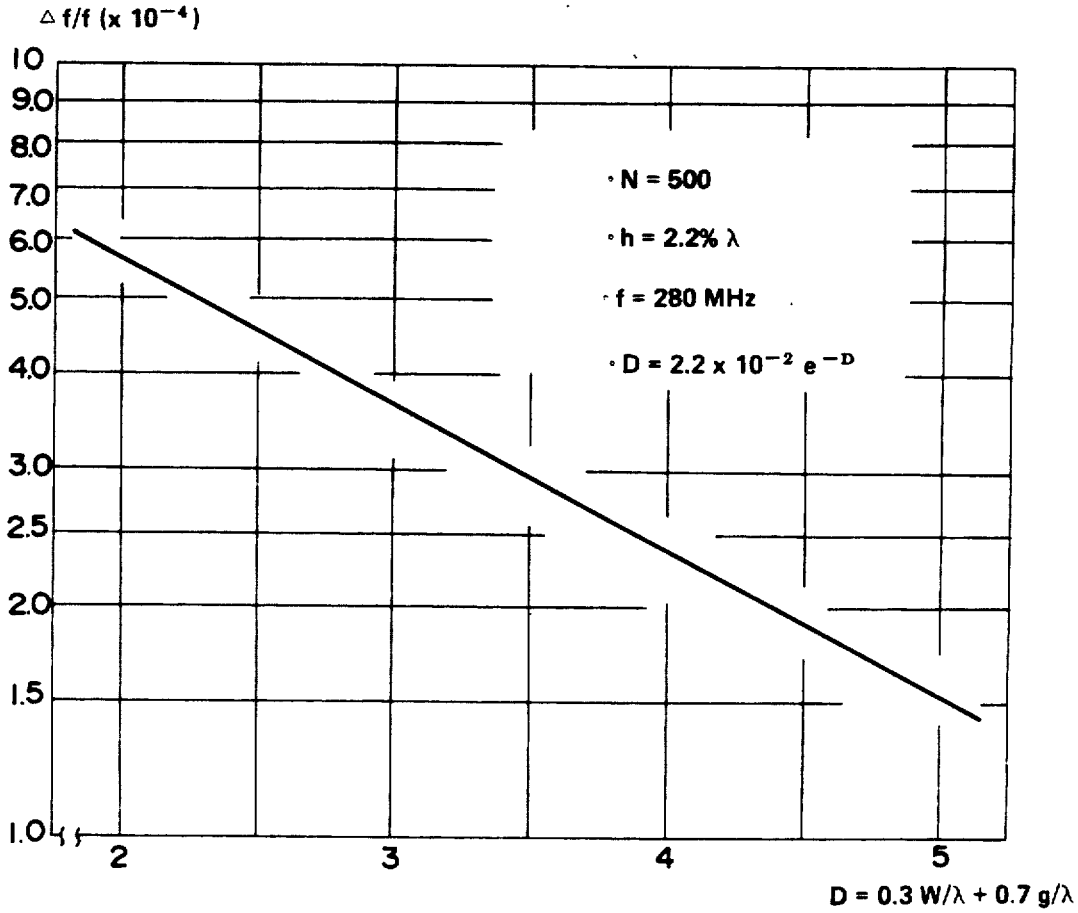
FIG. 8 shows experimental data when the data of FIGS. 6 and 7 are combined.
FIG. 9 is a table showing experimental data as to whether or not the acoustic coupling has actually occurred when the parameters g and w are both varied.

Examination has been made in the above experiment as to the case where the electrode thickness h and the number of electrode finger pairs N are varied in addition to the parameters w and g, and it has been found that the curve given in FIG. 8 is slightly shifted parallelly and variations in both parameters will not have a significant effect on the acoustic coupling. Therefore, the detailed explanation thereabout is omitted, and it will be sufficient to say that the proportional constant K is varied slightly in response to the variation of the parameters h and/or N, and that, for example, when the electrode thickness was between 0.5% and 4% with respect to the wavelength of the surface wave and the number was between 400 and 800, the constant K was varied between $1.5\times10^{-2}$ and $3\times10^{-2}$.

Next, examination was made as to the limit values of the parameters w and g and the results shown in FIG. 9 were obtained.

That is, it has been found that the limits of the parameters g and w are about 6λ and 20λ respectively when the presence or absence of the acoustic coupling is determined on the basis of an impedance characteristic of the filter in which values of w and g were varied.

In an actual filter design, when the parameter w is below 5λ, the Q value of the resonator becomes very low, which may make it difficult to put the filter to practical use. On the other hand, when the parameter w is close to 20λ, the vibration energy is substantially trapped in the acoustic aperture. Accordingly, even if the value g is selected to be small to its manufacturable limit level, the acoustic coupling becomes very weak, which results in a filter having a very narrow pass band width and being of no practical use.

As a result, the inventors have concluded from the above experimental results that the value w must be selected to be below 20λ and the value g must be selected to below 6λ, preferably below 3λ.

In other words, the band width of this type of filter depends on the parameter [D=(≠0.3w/λ)] $D=0.3(w/\lambda)+0.7(g/\lambda)$, and it is clear that the parameter g has an effect on the acoustic coupling which is about 2.5 times stronger than that of the parameter w. Thus, it is found the value g must be made extraordinarily small when compared with that in the prior art in order that the filter can exhibit its filtering function.

For example, it is assumed that a narrow band pass filter has a specific band width of between $10^{-4}$ and $10^{-3}$ and thus, if the filter has a center frequency of 280 MHz and a band width of 280 MHz and the parameter w is set to be 10λ, then the parameter g has a value of about 10 μm and the width of the common bus bar 6 is 5 μm at the largest.

This bus bar width of 5 μm is equal to slightly less than two times the width (about 2.8 μm) of an IDT electrode finger in a resonator and thus, this means that the common bus bar must be made very narrow, unlike a conventional prior art bus bar in which it has been unnecessary to take the ohmic loss of the bus bar into consideration. Since such a narrow bus bar is essential requirement if the SAW double mode filter is to function as a filter, it is necessary to minimize the ohmic loss of the common bus bar to prevent reduction of the Q value, as will be described later.

Attention will be directed again to the above-mentioned experimental conditions. In the above experiment, the ST cut quartz crystal substrate having a cut angle of 37° has been used as the piezo-electric substrate. The reason why a cut angle of 37° has been chosen is, as is well known, for compensating for a shift in the peak temperature of the quartz crystal frequency-temperature characteristic caused by mass loading of the electrode.

However, since the electrode film thickness will not have a significant effect on the acoustic coupling as has been mentioned already, a quartz crystal substrate having a cut angle of between about 30° and about 43° in the rotated Y-cut system can be used. Incidentally, the cut angle of 30° is an angle for shifting the peak temperature of quartz crystal to room temperature when the aluminum electrode thickness is 5-6% with respect to the wavelength of the SAW (spurious will be increased if the electrode thickness exceeds 5-6%), while the cut angle of 43° is an angle at which the peak temperature of the non-electrode ST cut quartz coincides with room temperature.

When the cut angle of the quartz crystal substrate is in the above range, the substrate exhibits the most favorable frequency-temperature characteristic, but in manufacturing a filter, the cut angle is not limited to the above range and other cut angles may be employed according to the specifications of the filter.

Although the above explanation has been made with reference to the multiple mode filter based on a SAW resonator, the present invention can be similarly applied to a multiple mode filter based on a SSBW resonator.

As well known, a SSBW is a wave which propagates immediately below the surface of a piezo-electric substrate and is generated when a rotated Y cut quartz crystal substrate has a cut angle of minus 50° or so and the IDT electrode is attached on the main surface of the substrate to propagate a wave in the Z' direction. *In this connection, the IDT must be attached on the surface of the piezoelectric substrate in the Z' direction in order to excite the SSBW. By disposing the IDT in this manner, the excited SSBW propagates along the IDT. Incidentally, the SAW propagates in the X direction of the ST cut quartz substrate.*

The pattern of vibration energy trapped in the ITD electrode of the SSBW filter, especially, the energy distribution in the wave propagating direction, is exactly the same as that of the SAW resonator.

Therefore, it will be easily appreciated that, if the SSBW resonators are positioned to meet the requirements obtained from the above experiment, similar acoustic coupling can be obtained.

Finally, explanation will be directed to problems involved when the SAW or SSBW double mode filter is to be put to practical use in accordance with the present invention.

In the above explanation, the resonator in the filter of the present invention has been of the so-called comb or multiple pair electrode type where multiple pairs of [TDT] *IDT* electrodes are employed to obtain a high Q value of the resonator, but for the same purpose, the resonator may be of a so-called reflector type where reflectors are disposed on the both sides of the IDT electrodes.

Since this reflector type resonator can have a sufficiently high Q value even if the IDT comprises a relatively small number of electrode fingers pairs, the common bus bar of the IDT can be made short and correspondingly the ohmic loss of the bus bar can be decreased and in addition, the characteristic impedance can be designed freely. For these reasons, it is considered, from the standpoint of arranging a filter according to the present invention, that the employment of the reflector type resonator is more preferable than the multiple pair electrode type resonator.

Figure 10:
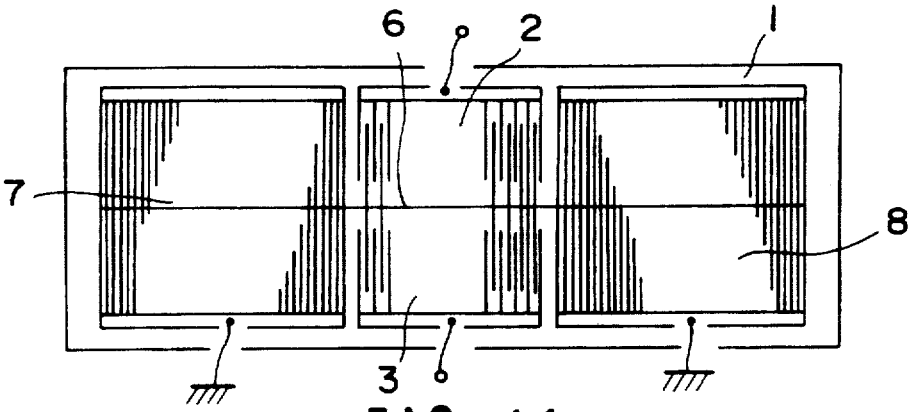
FIGS. 10 to 17 are different embodiments of the filter embodying the present invention.

More specifically, even in the case when reflectors 7 and 8 are disposed on both sides of the IDTs 2 and 3 and the number of IDT electrode fingers is set to be approximately 20% of that of the multiple pair electrode type resonator as shown in FIG. 10, the reflector type resonator can have a Q value equal to or higher than that of the multiple pair electrode type resonator having electrode fingers corresponding in number to the total number of electrode fingers of IDTs 2 and 3 and the electrode fingers of reflectors 7 and 8.

In this connection, if the pitch of the grating of the reflectors 7 and 8 is designed to be slightly wider (by several hundredths), than that of the IDT, the excited wave can be efficiently reflected. When a filter is constructed with the reflector type filter reflectors, as mentioned above, the width of the common bus bar 6 must be about 5 μm at the largest, as mentioned earlier, and thus it is practically impossible to bond leading wires onto such a narrow bus bar. For this reason, the common bus bar 6 is formed integral with the reflectors 7 and 8 and the IDTs are grounded through the bus bar of the reflectors 7 and 8.

Such an arrangement enables the reduction of the ohmic loss of the common bus bar 6, whereby the filter loss can be reduced.

Although the above explanation has been made with respect to the basic arrangement in which the present invention is applied to a practical filter, the invention can be modified and developed as follows on the basis of the basic arrangement.

Figure 11:
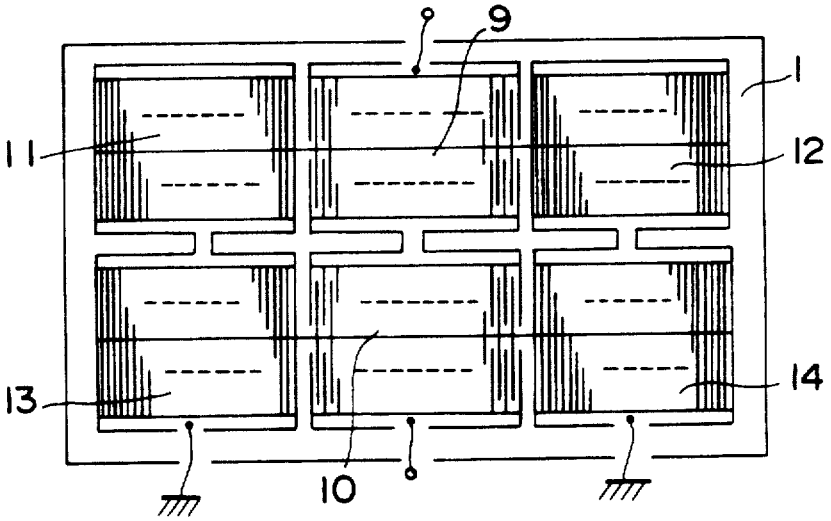

FIG. 11 shows the electrode pattern of a multi-sectioned double mode filter wherein two of the above-mentioned double mode filters are electrically connected in a tandem manner. More specifically, in the drawing, reflectors 11, 12, 13, and 14 are formed on both sides of respective double mode resonator filters 9 and 10 on the single substrate 1, and the IDT electrodes and reflectors are formed in one shot by photolithography.

Figure 12:
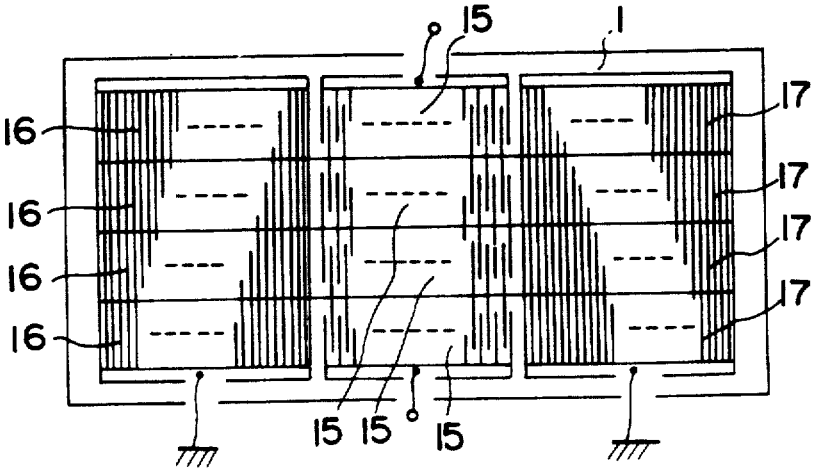

Referring further to FIG. 12, there is shown yet another embodiment wherein plural pairs of reflectors 16 and 17 are positioned on both sides of respective IDTs 15 in a multi-staged and adjacent relation.

The filter arranged as above can provide a high-order shape factor and highly guaranteed attenuations due to the resonance frequency of each mode generated by the acoustic coupling of the vibration energy, and can also provide odd-order shape factor. On the other hand, the above double mode filter or the filter comprising multiple stages of the double mode filters can provide only an even-order shape factor.

The above-mentioned filters can be designed with the exact design method in which each resonator is represented by respective equivalent constants through the Chebyshev characteristic with attenuation peaks.

Figure 13:
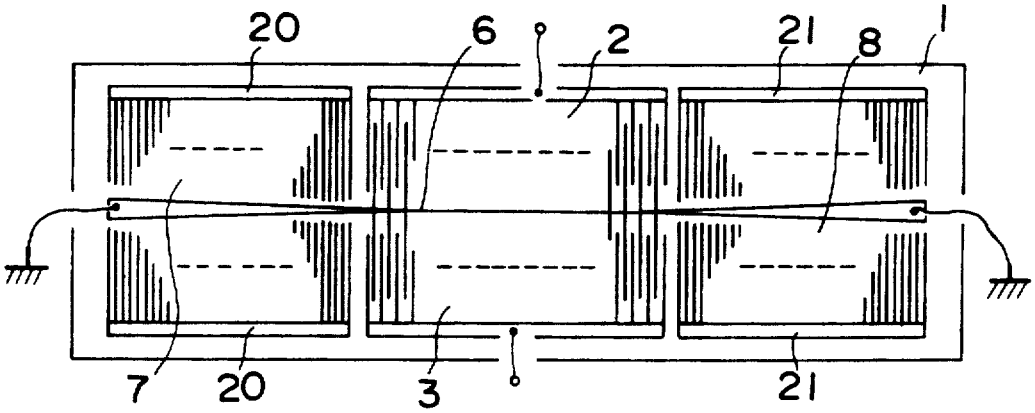

There is shown in FIG. 13 a still further embodiment intended to reduce the above-mentioned ohmic loss of the common bus bar, wherein the common bus bar 6 for a relatively small number of electrode finger pairs in the IDTs 2 and 3 is not connected to the gratings of the reflectors 7 and 8 provided on the both sides of said IDTs 2 and 3 and extends across the gratings, the width of the common bus bar being gradually increased as the bus bar enters the reflectors, ground wires being bonded to the widest ends of the bus bar around the edges of the substrate 1, these wires being connected to ground.

Since the length of the narrowest portion of the common bus bar 6 corresponds to that of the IDTs 2 and 3 and the other portions of the bus bar are made wide, the ohmic loss of the bus bar can be minimized and correspondingly the filter loss can be minimized.

In this case, with respect to the shape of the gratings in each reflector 7 or 8, the length of the strips of the gratings is gradually decreased toward the outer side of the reflector. Such a grating structure might have an adverse effect on the propagation and reflection of the excited SAW and thus on the characteristic of the filter, but it has been confirmed from our experiments that such a structure will have no effect on the filter characteristics.

This is presumably because the reflection of the SAW propagating toward the reflectors 7 and 8 weakens gradually as the wave nears the outer side of the reflectors so that the decrease in strip length of the grating corresponds substantially to the energy attenuation of the SAW.

With respect to the shape of the common bus bar 6 across the reflector gratings, it has been confirmed that a triangle or a part of an ellipse having a major axis corresponding to the width of the electrodes including the reflector electrodes in the SAW-wave propagating direction and a minor axis corresponding to the width of the electrodes perpendicular to the SAW direction can be employed as the bus bar shape. while the filter characteristic is substantially the same as that obtained in the above embodiments.

Figure 14:
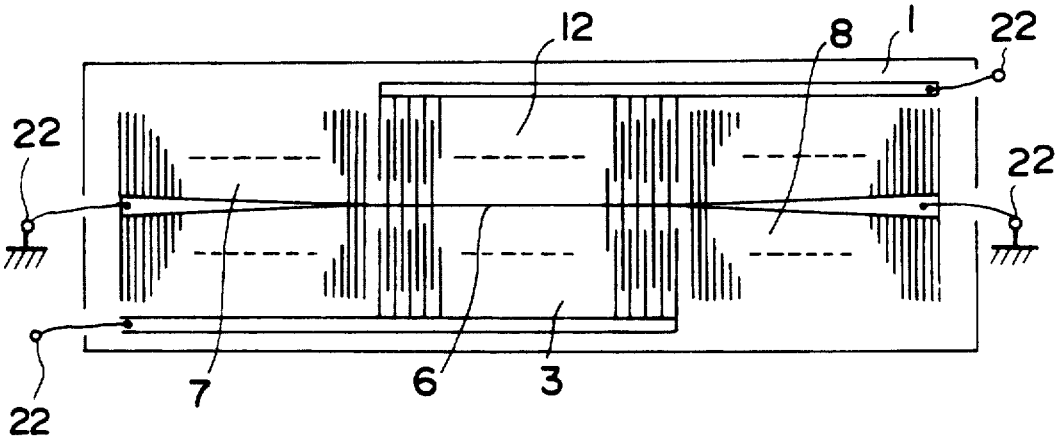

FIG. 14 shows a modification of the embodiment of FIG. 13, providing the same effect as the embodiment of FIG. 13. In FIG. 14, bus bars 20 and 21 on both sides of the respective gratings in reflectors 7 and 8 in FIG. 13 are removed and the above-mentioned tapered common bus bar 6 is extended across the gratings of reflectors 7 and 8 and connected to the gratings.

For example, if the common bus bar of the electrodes of the IDTs 2 and 3 is symmetrically extended to the ends of the reflectors on the piezo-electric substrate 1, then the positions of lead terminals 22, passing through a package (not shown) in an air-tight and electrically insulated manner are rotation-symmetrical with respect to the center of the substrate 1, and thus the package can be mounted on a printed circuit board with great freedom with respect to its mounting direction. Further, since the hot terminals of the electrodes of the IDTs 2 and 3 are separated by the maximum distance, this enables the minimization of the effect on the filter characteristic due to the feedthrough signal.

Figure 15:
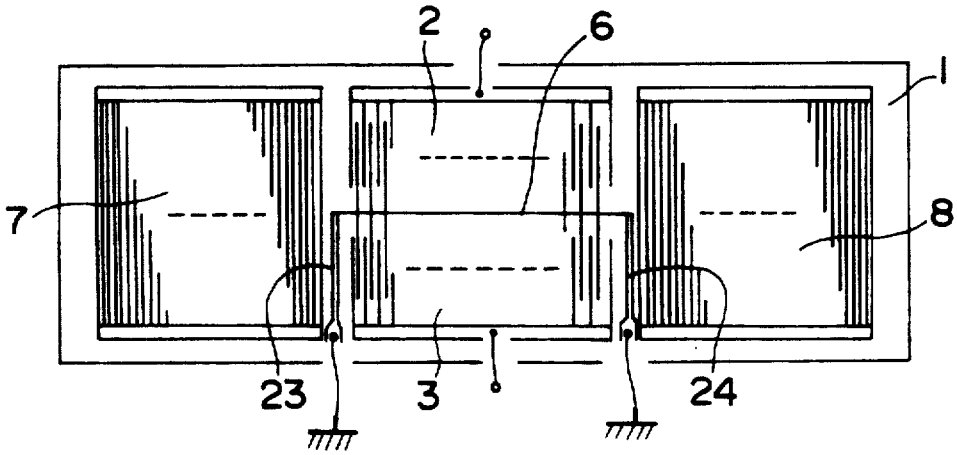

Referring to FIG. 15, there is shown another embodiment of the present invention, in which lead patterns 23 and 24 are provided between the IDTs 2 or 3 and the reflectors 7 and 8, one end of each of the lead patterns 23 and 24 is connected to the common bus bar 6 and the other and is guided to a peripheral edge of the piezoelectric substrate 1, and the lead patterns 23 and 24 are connected through the guided portions to lead terminals passed through a package of the filter in an electrically isolated manner therefrom.

Figure 16:
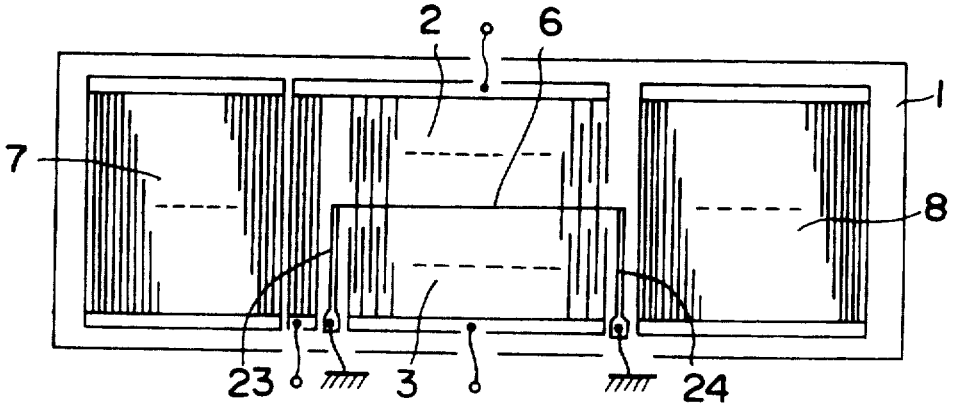

In another embodiment of the invention shown in FIG. 16, bus bars other than the common bus bar 6 are connected to some or all of the gratings of the reflectors 7 or 8, whereby the connecting portions of the strips of the grating connected to lead terminals can be arranged along one side of the substrate 1 and the wire bonding process can be simplified, whereby a filter with high reliability can be obtained.

Figure 17:
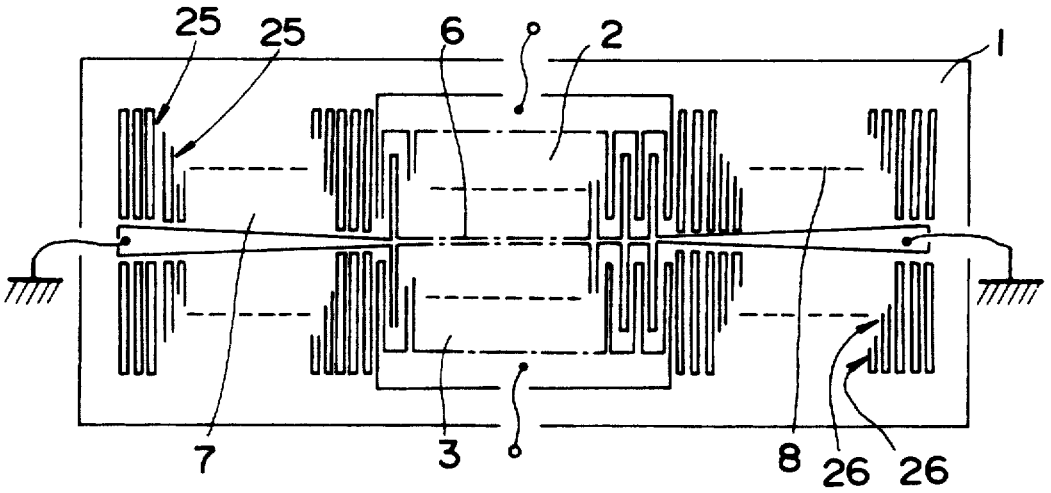

FIG. 17 is another embodiment of the present invention. In this case, the common bus bar 6 for a relatively small number of electrode pairs of the IDTs 2 and 3 extends across the reflectors 7 and 8 provided on both sides of the IDTs 2 and 3 on the piezo-electric substrate 1, and the width of the common bus bar 6 is gradually increased toward the outer side ends of the reflectors 7 and 8. The reflectors 7 and 8 are formed by etching a number of mutually separated grooves 25 and 26 on the substrate 1.

With such a structure, when grounding wires are bonded to the widest end portions of the common bus bar 6, the other bus bar of the IDTs can be connected to the lead terminals with ease. At the same time, the ohmic loss of the common bus bar 6 can be minimized and thereby the loss of the filter can be minimized.

It goes without saying that, if the reflectors 7 and 8 each comprise metal strips instead of the grooves 25 and 26, the filter can exhibit a similar effect.

We claim:

1. A high-frequency narrow-band pass [multimode] *double-mode* filter comprising first and second resonators arranged adjacent to each other, each of said resonators having the same resonance frequency and comprising a pair of comb-type interdigital transducer electrode arrays, the electrodes of said arrays being interleaved with each other, and a common bus bar provided between *and connected to* said first and second resonators, said first and second resonators being arranged in directions perpendicular to [the] *a* propagation [directions] *direction* of waves excited by said resonators and in close proximity to each other on a piezoelectric substrate so that acoustic coupling *occurs* between said first and second resonators [is attained], thereby causing first and second resonance frequencies of different vibrating modes, the overlap of the electrodes of said respective pairs of electrode arrays of said first and second resonators defining respective first and second acoustic [aperatures] *apertures* of width W and the distance between said first and second acoustic aperatures defining a gap g, said filter utilizing said first and second resonance frequencies of different vibration modes generated by the acoustic coupling, wherein said width w and gap g satisfies the relation $w \leqq 20\lambda$ and $g \leqq 6\lambda$, where $\lambda$ is the wavelength of [the wave excited by said resonators] *a wave corresponding to said same resonance frequency of each of said resonators,*

*wherein reflectors comprising a multiplicity of gratings made of metal strips are provided on both sides of said resonators to reflect waves corresponding to said first and second resonance frequencies of different vibrating modes resulting from said acoustic coupling, and*

*wherein said common bus bar is formed integrally with and connected to at least one of the gratings of the reflectors, and said common bus bar is grounded through at least one grating such that the ohmic loss of said bus bar and the loss of said filter is reduced.*

2. A filter as set forth in claim 1, wherein a wave excited by said resonators is a surface skimming bulk wave (SSBW).

3. A high frequency narrow-band pass [multimode] *double mode* filter of multi-section type, wherein said filter set forth in claim 1 forms a unit section and a plurality of said unit sections are connected in a tandem manner so as to provide filter characteristics of a desired shape factor and relative attenuation.

[4. A filter as set forth in claim 3, wherein reflectors comprising a multiplicity of gratings made of grooves in said substrate are provided on both sides of said resonators to reflect a wave excited by said resonators.]

[5. A filter as set forth in claim 3, wherein reflectors comprising a multiplicity of gratings made of metal strips are provided on both sides of said resonators to reflect a wave excited by said resonators.]

6. A [filter as set forth in claim 1] *high-frequency narrow-band pass double-mode filter comprising first and second resonators arranged adjacent to each other, each of said resonators having the same resonance frequency and comprising a pair of comb-type interdigital transducer electrode arrays, the electrodes of said arrays being interleaved with each other, and a common bus bar provided between and connected to said first and second resonators, said first and second resonators being arranged in directions perpendicular to a propagation direction of waves excited by said resonators and in close proximity to each other on a piezoelectric substrate so that acoustic coupling occurs between said first and second resonators, thereby causing first and second resonance frequencies of different vibrating modes, the overlap of the electrodes of said respective pairs of electrode arrays of said first and second resonators defining respective first and second acoustic apertures of width w and the distance between said first and second acoustic apertures defining a gap g, said filter utilizing said first and second resonance frequencies of different vibration modes generated by the acoustic coupling, wherein said width w and gap g satisfies the relation $w \leqq 20\lambda$ and $g \leqq 6\lambda$, where $\lambda$ is the wavelength of a wave corresponding to said same resonance frequency of each of said resonators,* wherein reflectors comprising a multiplicity of gratings made of grooves in said substrate are provided on both sides of said resonators to reflect [a wave excited by said resonators] *waves corresponding to said first and second resonance frequencies of different vibrating modes resulting from said acoustic coupling.*

[7. A filter as set forth in claim 6, wherein said common bus bar is formed integrally with at least some of said gratings of the reflectors, whereby the connecting points of said interdigital transducer electrodes with lead terminals can be positioned with a high degree of freedom.]

8. A filter as set forth in claim [7] *6*, wherein waves excited by said resonators [are] *include different types of* waves other than [SAW excitable by said resonators] *a surface acoustic wave.*

[9. A filter as set forth in claim 6, wherein said common bus bar is formed integrally with the gratings of said reflectors and is connected to the gratings, and said common bus bar is grounded, whereby connecting points of said common bus bar with the lead terminals are positioned with a high degree of freedom and the ohmic loss of said common bus bar and the loss of the filter is reduced.]

10. A filter as set forth in claim 6, wherein *the reflectors each have an inner side adjacent the resonators and an outer side opposite the inner sides and wherein* said common bus bar is extended across the gratings of said reflectors and is not connected to the gratings, [and the width of] said *common* bus bar [in the gratings] *having a width which* is gradually increased *from the inner side of a reflector* toward the outer side thereof.

11. A filter as set forth in claim [6] *1*, wherein *the reflectors each have an inner side adjacent the resonators*

*and an outer side opposite the inner side and wherein* said common bus bar is extended across the gratings of said reflectors and is connected to the gratings, [and the width of] said common bus bar [in the gratings] *having a width which* is gradually increased *from the inner side of a reflector* toward the outer [sides] *side* thereof.

[12. A filter as set forth in claim 6, wherein said common bus bar is connected to lead patterns, said patterns are provided in place between said resonators and said reflectors, are extended from a point to which said common bus bar is connected to a peripheral edge of said piezo-electric substrate.]

13. A filter as set forth in claim 1, wherein preferably $g \leqq 3\lambda$.

14. A filter as set forth in claim 1, wherein a wave excited by said resonators is a surface acoustic wave (SAW).

[15. A filter as set forth in claim 1, wherein reflectors comprising a multiplicity of gratings made of metal strips are provided on both sides of said resonators to reflect a wave excited by said resonators.]

*16. A filter as set forth in claim 1 wherein said common bus bar has a width on the order of g/2, and is connected to substantially all of said multiplicity of gratings.*

*17. A filter as set forth in claim 1 wherein said common bus bar has a width, said width is slightly less than twice a width associated with an individual interdigital transducer electrode.*

*18. A filter as set forth in claim 1 wherein said common bus bar is connected to substantially all of said gratings.*

*19. A tandem connected multi-sectioned double-mode surface acoustic wave (SAW) filter formed on a single piezoelectric substrate, comprising:*

*a pair of double mode filter sections formed in spaced parallel alignment on a surface of said single piezoelectric substrate, each of said double mode filter sections itself comprising:* first and second SAW resonators, having the same resonant frequency, arranged in parallel, closely opposed relationship so as to be acoustically coupled to each other and thereby generate two different vibration modes of first and second resonance frequencies, each of said resonators comprising an interdigitated transducer (*IDT*) *having first and second comb type electrode arrays that are interleaved with each other, there being a central common bus bar disposed between said first and second resonators and extending in a direction parallel to a propagation direction of surface acoustic waves excited by each of said resonators, the first electrode array of each resonator extending from and being electrically connected to said common bus bar,*

*a reflector at each end of said interdigitated transducer, each of said reflectors comprising a grating made of metal strips,*

*said common bus bar extending beyond both ends of said interdigitated transducers and being connected to substantially all of the metal strips of said reflectors, so that said transducers are grounded through said common bus bar and said reflectors,*

*said pair of double mode filter sections being separated by sufficient distance so that acoustic coupling therebetween does not take place,*

*an interconnection bus, having a width wider than widths of said common bus bars of the pair of filter sections, interconnecting the second electrode array of the first resonator of one of said filter sections to the second electrode array of the second resonator of the other filter section, thereby interconnecting an output of one filter section to an input of the other filter section, and*

*a connection bus for the second electrode array of said second resonator of said one filter section and a like connection bus for the second electrode array of said second resonator of the other filter section, the connection buses having a width wider than widths of said common bus bars and being disposed to facilitate input and output connection to said tandem connected filter.*

*20. A surface acoustic wave transducer according to claim 19 wherein in each SAW resonator, the first and second electrode arrays define respective first and second acoustic apertures of width w and the distance between said first and second acoustic apertures defines a gap g, said filter utilizing said first and second resonance frequencies of different vibration modes resulting from said acoustic coupling between said pair of resonators, wherein said width w and gap g satisfy the relation $w \leqq 20\lambda$ and $g \leqq 6\lambda$, where $\lambda$ is a wavelength of a wave corresponding to said same resonance frequency of each of said resonators.*

*21. A surface acoustic wave transducer according to claim 20 wherein said common bus bar has a width on the order of g/2.*

*22. A surface acoustic wave transducer according to claim 21 wherein each common bus bar has a width, said width is slightly less than twice a width associated with an individual array electrode.*

*23. A high-frequency narrow-band pass multi-mode filter comprising at least two resonators arranged adjacent to one another, each of said resonators having the same resonance frequency and comprising a pair of comb-type interdigital transducer electrode arrays, the electrodes of said arrays being interleaved with each other, and wherein a common bus bar is provided between and connected to two of said adjacent resonators, each of said resonators being arranged in directions perpendicular to a propagation direction of waves excited by said resonators on a piezoelectric substrate so that acoustic coupling occurs between said resonators, thereby causing multiple resonance frequencies of different vibrating modes, the overlap of the electrodes of respective pairs of electrode arrays of said resonators defining respective first and second acoustic apertures of width w and the distance between said first and second acoustic apertures defining a gap g, said filter utilizing said multiple resonance frequencies of different vibration modes generated by the acoustic coupling, wherein said width w and gap g satisfies the relation $w \leqq 20\lambda$ and $g \leqq 6\lambda$, where $\lambda$ is the wavelength of a wave corresponding to said same resonance frequency of each of said resonators,*

*wherein reflectors comprising a multiplicity of gratings made of metal strips are provided on both sides of said resonators to reflect waves corresponding to said multi-mode vibrations resulting from said acoustic coupling, and*

*wherein said common bus bar is formed integrally with and connected to at least one of the gratings of the reflectors, and said common bus bar is grounded through at least one grating such that the ohmic loss of said bus bar and the loss of said filter is reduced.*

*24. A high frequency narrow-band multi-mode filter of multi-section type as set forth in claim 23, wherein the gratings have an outer side and the common bus bar has a width, wherein said common bus bar is extended across the gratings of said reflectors, and the width of said bus bar in*

*the gratings is gradually increased toward the outer side thereof.*

*25. A high frequency narrow-band multi-mode filter of multi-section type, wherein said filter set forth in claim 23 forms a unit section and a plurality of said unit sections are connected in a tandem manner so as to provide filter characteristics of a desired shape factor and relative attenuation.*

*26. A high-frequency narrow-band pass multi-mode filter comprising at least two resonators arranged adjacent to one another, each of said resonators having the same resonance frequency and comprising a pair of comb-type interdigital transducer electrode arrays, the electrodes of said arrays being interleaved with each other, and wherein a common bus bar is provided between and connected to two of said adjacent resonators, each of said resonators being arranged in directions perpendicular to a propagation direction of waves excited by said resonators on a piezoelectric substrate so that acoustic coupling occurs between said resonators, thereby causing multiple resonance frequencies of different vibrating modes, the overlap of the electrodes of respective pairs of electrode arrays of said resonators defining respective first and second acoustic apertures of width w and the distance between said first and second acoustic apertures defining a gap g, said filter utilizing said multiple resonance frequencies of different vibration modes generated by the acoustic coupling, wherein said width w and gap g satisfies the relation $w \leqq 20\lambda$ and $g \leqq 6\lambda$, where $\lambda$ is the wavelength of a wave corresponding to said same resonance frequency of each of said resonators,*

*wherein reflectors comprising a multiplicity of gratings made of grooves in said substrate are provided on both sides of said resonators to reflect waves corresponding to said vibrations of different modes resulting from said acoustic coupling.*

* * * * *